(12) United States Patent
Song et al.

(10) Patent No.: US 8,095,085 B2
(45) Date of Patent: Jan. 10, 2012

(54) AUTOMATIC ANTENNA TUNING UNIT FOR SOFTWARE-DEFINED AND COGNITIVE RADIO

(75) Inventors: Hang Song, Tempe, AZ (US); James T. Aberle, Tempe, AZ (US); Bertan Bakkaloglu, Scottsdale, AZ (US)

(73) Assignee: Arizona Board of Regents for and on Behalf of Arizona State University, Scottsdale, AZ (US)

( * ) Notice: Subject to any disclaimer, the term of this patent is extended or adjusted under 35 U.S.C. 154(b) by 807 days.

(21) Appl. No.: 12/134,438

(22) Filed: Jun. 6, 2008

(65) Prior Publication Data
US 2009/0046030 A1 Feb. 19, 2009

Related U.S. Application Data

(60) Provisional application No. 60/942,776, filed on Jun. 8, 2007.

(51) Int. Cl.
*H03C 1/52* (2006.01)
*H04K 3/00* (2006.01)

(52) U.S. Cl. ........................... 455/107; 455/126

(58) Field of Classification Search ............ 455/107, 455/115.1, 120–121, 125–126; 333/17.3, 333/32; 343/860–861
See application file for complete search history.

(56) References Cited

U.S. PATENT DOCUMENTS

| | | | |
|---|---|---|---|
| 4,041,395 A * | 8/1977 | Hill | 455/115.4 |
| 5,778,308 A | 7/1998 | Sroka et al. | 455/115 |
| 6,029,051 A | 2/2000 | Osterberg et al. | 455/115 |
| 6,710,651 B2 * | 3/2004 | Forrester | 330/129 |
| 6,747,956 B1 | 6/2004 | Darack et al. | 370/252 |
| 7,180,467 B2 | 2/2007 | Fabrega-Sanchez et al. | 343/861 |
| 2005/0215281 A1 | 9/2005 | Oodaira | 455/553.1 |

FOREIGN PATENT DOCUMENTS

| | | |
|---|---|---|
| EP | 1 475 889 A2 | 11/2004 |
| WO | WO 2004/098076 | 11/2004 |

OTHER PUBLICATIONS

Aberle and Oh, "Reconfigurable Antenna Technology for VHF/UHF Applications," *Technical Report: General Dynamics Decision System*, Oct. 2004.
Aberle et al., "Automatically Tuning Antenna for Software-Defined and Cognitive Radio," Proceedings of the 2005 Software Defined Radio Technical Conference, Nov. 2005.
Aberle et al., "Reconfigurable Atennas for Portable Wireless Devices," *IEEE Antennas and Propagation Magazine*, 45 (6): 148-154, 2003.

(Continued)

*Primary Examiner* — Lee Nguyen
(74) *Attorney, Agent, or Firm* — Fulbright & Jaworski L.L.P.

(57) ABSTRACT

A closed-loop controlled antenna tuning unit (ATU) system includes a return loss detector connected to sample an RF signal generated by a signal source to provide a return loss signal. A matching state searching circuit is connected to receive the return loss signal and, in response, selectively store a return loss value and an impedance matching state. A central controller is connected to provide a switch control signal and apply an optimum matching state to the impedance synthesizer at the conclusion of the matching state search. An impedance synthesizer is responsive to the switch control signal for coupling a radio frequency signal and matching the impedance of an antenna to a signal source.

20 Claims, 11 Drawing Sheets

OTHER PUBLICATIONS

Belander, "Developing a GSM Modern on a DSP/FPGA Architecture," *Xcell Journal*, Winter 2004.

Benson, "System-Level Design Using FPGAs and DSPs: An Example Showing Software-Defined Radio," *RTC Magazine*, pp. 1-6, 2008.

Brown, "RF-MEMS Switches for Reconfigurable Integrated Circuits," *IEEE Transactions on Microwave Theory and Techniques*, 46 (11): 1868-1880, 1998.

Galal, "10-Gb/s Limiting Amplifier and Laser/Modulator Driver in 0.18-µm CMOS Technology," *IEEE J. of Solid-State Circuits*, 38 (12): 2138-2146, 2003.

Huang et al., "A 2-V 10.7-MHz CMOS Limiting Amplifier/RSSI," *IEEE J. of Solid-State Circuits*, 35 (10): 1474-1480, 2000.

Ida et al., "An Adaptive Impedance Matching System for Mobile Communication Antennas," IEEE Antennas and Propagation Society International Symposium, vol. 3 (20-25): 3203-3206, 2004.

Lin and Huang, "A 15mW 280MHz 80dB Gain CMOS Limiting/Logarithmic Amplifier with Active Cascode Gain-Enhancement," *ESSCIRC*, pp. 311-314, 2002.

Mingo et al., "An RF Electronically Controlled Impedance Tuning Network Design and Its Application to an Antenna Input Impedance Automatic Matching System," *IEEE Transactions on Microwave Theory and Techniques*, 52 (2): 489-497, 2004.

Oh and Aberle, "Reconfigurable Antennas as an Enabling Technology for SDR," Proceedings of the 2004 Software Defined Radio Technical Conference, pp. 29-33, 2004.

Oh et al., "Automatic antenna-tuning unit for software-defined and cognitive radio," *WIREless Communications and Mobile Computing*, 7: 1103-1115, 2007.

Oh et al., "Electronically Tunable Antenna Pair and Novel RF Front-End Architecture for Software-Defined Radios," *EURASIP J. on Applied Signal Processing*, 16: 2701-2707, 2005.

Oh, "Automatically Tuning Antenna System for Software-Defined and Cognitive Radio," Ph.D. Dissertation, Arizona State University, May 2006.

Sackinger and Fischer, "A 3-GHz 32-db CMOS Limiting Amplifier for SONET OC-48 Receivers," *IEEE J. of Solid-State Circuits*, 35 (12): 1884-1888, 2000.

Sun and Fidler, "Design of Π Impedance Matching Networks," IEEE International Symposium on Circuits and Systems, ISCAS'94, 5: 5-8, 1994.

Tsurumi and Suzuki, "Broadband RF Stage Architecture for Software-Defined Radio in Handheld Terminal Applications," *IEEE Communications Magazine*, February: 90-95, 1999.

Yoshida et al., "Broadband RF Front-end and Software Execution Procedure in Software-defined Radio," IEEE, pp. 2133-2137, 1999.

* cited by examiner

AUTOMATIC ANTENNA TUNING UNIT FOR SOFTWARE-DEFINED AND COGNITIVE RADIO

RELATED APPLICATIONS

This patent application claims priority to, and incorporates by reference in its entirety, U.S. Provisional Application No. 60/942,776 entitled "Automatic Antenna Tuning Unit for Software-Defined and Cognitive Radio," by Hang Song, et al., filed on Jun. 8, 2007.

STATEMENT REGARDING FEDERALLY SPONSORED RESEARCH OR DEVELOPMENT

This invention was made in part with government support under Grant No. 0226846 awarded by the National Science Foundation. The United States Government has certain rights in the invention.

BACKGROUND OF THE INVENTION

1. Field of the Invention

The present invention relates generally to radio systems and, more particularly, to systems and methods for automatic antenna matching for software-defined radio systems.

2. Description of Related Art

At the present time, there is tremendous demand for antennas with high efficiencies in very small form factors that fit inside ever-shrinking portable wireless devices like handsets and personal digital assistants. These antennas must cover a variety of frequency bands and support different wireless standards. Traditionally, antenna engineers have designed antennas for these applications using computationally-intensive full-wave electromagnetic simulation followed by long hours in the lab tweaking performance. It has become increasingly apparent that the requirements of software-defined radio (SDR) and its proposed successor, cognitive radio, will render this approach untenable.

One solution involves the use of automatic antenna matching techniques and devices that are widely used at lower radio frequencies (50 MHz and below). One area of effort has been to create these types of devices for use in commercial wireless and military communications systems, with particular concern for SDR systems. In a conventional antenna tuning system, the incident and reflected powers are coupled through a directional coupler in addition to two radio frequency (RF) power detectors, and then detected power levels are converted into digital domain; finally the return loss is computed by finding the difference between the two in digital domain. However, high accuracy ADCs are expensive, require moderate power and occupy significant space on a printed circuit board (PCB).

SUMMARY OF THE INVENTION

The present invention includes embodiments having an architecture with a closed-loop controlled antenna tuning unit (ATU) system as illustrated in FIG. 1 (only transmitting path is shown). The present invention does not require the use of analog-to-digital converters (ADCs). Using the ATU, the narrow instantaneous bandwidth of an electrically small antenna (ESA) is automatically tuned over a much wider frequency range by the ATU. This matching scheme ensures that the narrowband antenna is automatically matched to any desired frequency under all environmental conditions using circuits with practical component values and tolerances. It is desirable that the entire tuning process be completed rapidly using efficient algorithms and fast hardware, and for these algorithms and hardware to consume as little power as possible.

The advantages of the proposed system are as follows:

1) Since no analog-to-digital converters (ADCs) are used, the accuracy of the circuit is no longer determined by the number of bits of the ADCs.

2) Each change of impedance state is completed in one clock cycle eliminating the trade-off between conversion speed (number of clock cycles per conversion), number of bits (accuracy) and power consumption from the ADCs.

3) The simplification of the circuits considerably reduces the power consumption at the same clock frequency as compared to circuits using ADCs.

4) Use of logarithmic power detectors greatly reduces the requirements for the dynamic range of subsequent tuning stages.

5) In addition to the closed-loop system, a coarse-tuning step is also enabled by changing the state of a control element in the antenna aperture. This open-loop tuning feature greatly increases the range of frequencies over which the closed-loop system can work.

According to an aspect of the invention, an automatic antenna tuning unit includes a return loss detector connected to sample an RF signal to provide an analog quality of match (return loss) signal; a matching state searching circuit connected to receive the return loss signal and, in response, selectively store a return loss value and an impedance matching state; a central controller responsive to the return loss value and the impedance matching state for providing a switch control signal and apply an optimum matching state at the conclusion of the matching state search; and an impedance synthesizer responsive to the switch control signal for coupling and matching the RF signal to an antenna.

According to a feature of the invention, the return loss detector may include a directional coupler connected to receive the RF signal and provide incident and reflected sampled signals; an incident power detector receiving the incident sampled signal to provide an incident power signal; a reflected power detector receiving the reflected sampled signal to provide a reflected power signal; and a subtractor receiving the incident and reflected power signals to provide the return loss signal. The incident and reflected power detectors may be logarithmic RF power detectors.

According to another feature of the invention, the directional coupler may be a three-line coupler connected to receive the radio frequency signal and provide independent degrees of coupling of incident and reflected signals to provide incident and reflected sampled signals of desired levels.

According to another feature of the invention, the matching state searching circuit may include a sample and hold (S/H) circuit connected to receive and selectively latch the return loss signal; and a comparator 121 connected to receive the return loss signal and an output from the S/H circuit and to provide a storing-action trigger signal.

According to another feature of the invention, the matching state searching circuit may also include a digital register connected to receive and selectively store the impedance matching state.

According to another feature of the invention, the central controller may be a digital processor operational to set an initial state of the antenna based on operating frequency information and run a search algorithm to thereby provide the switch control signal. Various searches may be implemented by the processor such as, for example, a nearest neighbors search, exhaustive search, etc.

According to another feature of the invention, the impedance synthesizer may be a lowpass-type pi-matching network which may then include a series inductor and first and second banks of parallel switched capacitors connected to respective opposite terminals of the inductor and ground.

According to another aspect of the invention, a method of matching the impedance of an antenna to a signal source includes the steps of generating a clock signal having first and second phases; generating a new matching state at a beginning of the first phase; computing a return loss; comparing the return loss to a previously stored return loss; latching a result of the step of comparing at a beginning of the second phase; selectively triggering a sampling action to store the return loss in response to a first value of the latched result; selectively storing a current impedance matching state in response to the first value of the latched result; and at the conclusion of the matching state search configuring a matching circuit in response to the stored optimum impedance matching state to optimize a matching condition.

In a further embodiment of the method, computing a return loss may also include receiving a radio frequency signal; providing a sample of an incident signal; providing a sample of a reflected signal; providing an incident power signal in response to the sample of the incident signal; providing a reflected power signal in response to the sample of the reflected signal; and generating a return loss signal in response to the incident power signal and the reflected power signal. Providing the sample of an incident signal and of a reflected signal may include providing independent degrees of coupling of the incident signal and of the reflected signal to providing the sample of the incident signal and the sample of the reflected signal at desired levels.

Comparing the return loss to a previously stored return loss may include receiving the return loss signal; selectively latching the return loss signal in a sample and hold (S/H) circuit; and comparing the return loss signal and an output signal from the S/H circuit. Configuring the matching circuit may further include setting an initial state of the antenna based on operating frequency information and running a search algorithm to thereby providing the switch control signal. In a further embodiment, the method includes storing the impedance matching state in a digital register.

A system for matching the impedance of an antenna to a signal source is also provided. In one embodiment, the system includes a signal source configured to generate a radio frequency signal for transmission; a transmission line coupled to the signal source configured to conduct the radio frequency signal; an antenna coupled to the transmission line configured to transmit the radio frequency signal wirelessly; and an antenna tuning unit coupled to the antenna and to the transmission line. The antenna tuning unit may include a return loss detector connected to sample the radio frequency signal to provide a return loss signal; a matching state searching circuit connected to receive said return loss signal and, in response, selectively store a return loss value and an impedance matching state; a central controller responsive to said return loss value and said impedance matching state for providing a switch control signal and apply optimum matching state at the conclusion of the matching state search; and an impedance synthesizer responsive to said switch control signal for coupling and matching the impedance of said antenna to said signal source.

It should be noted that, as used herein:

The term "coupled" is defined as connected, although not necessarily directly, and not necessarily mechanically. Specifically the term "coupled" includes electrically coupled either through a direct line or wire connection or through electromagnetic coupling of antennas, transmission lines, and other radio frequency devices.

The terms "a" and "an" are defined as one or more unless this disclosure explicitly requires otherwise.

The terms "substantially," "about," and their variations are defined as being largely but not necessarily wholly what is specified as understood by one of ordinary skill in the art, and in one non-limiting embodiment, the substantially refers to ranges within 10%, preferably within 5%, more preferably within 1%, and most preferably within 0.5% of what is specified.

The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

Other features and associated advantages will become apparent with reference to the following detailed description of specific embodiments in connection with the accompanying drawings.

BRIEF DESCRIPTION OF THE DRAWINGS

The following drawings form part of the present specification and are included to further demonstrate certain aspects of the present invention. The invention may be better understood by reference to one or more of these drawings in combination with the detailed description of specific embodiments presented herein.

DESCRIPTION OF ILLUSTRATIVE EMBODIMENTS

The invention and the various features and advantageous details are explained more fully with reference to the nonlimiting embodiments that are illustrated in the accompanying drawings and detailed in the following description. Descriptions of well known starting materials, processing techniques, components, and equipment are omitted so as not to unnecessarily obscure the invention in detail. It should be understood, however, that the detailed description and the specific examples, while indicating embodiments of the invention, are given by way of illustration only and not by way of limitation. Various substitutions, modifications, additions, and/or rearrangements within the spirit and/or scope of the underlying inventive concept will become apparent to those skilled in the art from this disclosure.

The present invention comprises systems and methods for automatically tuning the impedance of radio frequency load such as an antenna to match the impedance of a radio frequency signal source such as a power amplifier. In one embodiment, the present invention proves automatic antenna impedance matching techniques and devices for software-defined radio systems. In a conventional antenna tuning system, the incident and reflected powers are coupled through a directional coupler in addition to two RF power detectors, and then detected power levels are converted into digital domain; finally the return loss is computed by finding the difference between the two in digital domain. In embodiments of the present invention, no analog-to-digital converters (ADCs) are used. Instead, return loss is computed using an analog subtractor; by finding the difference between the outputs of the two logarithmic power detectors. As the antenna tuning system starts searching for the optimum matching state, the initial value of return loss and impedance synthesizer state are stored in an analog sample and hold (S/H) and digital register respectively. The return loss thereafter is compared with the one stored in the S/H. Whenever the current return loss is larger than the stored value, the former will replace the latter, and the digital register will store the new matching state. Thus the system will find the optimum matching state at the conclusion of the matching state search assuming a robust search algorithm is used. For example, a nearest neighbors search or exhaustive search technique may be implemented depending on the number of switch states available, etc.

Figure 1:
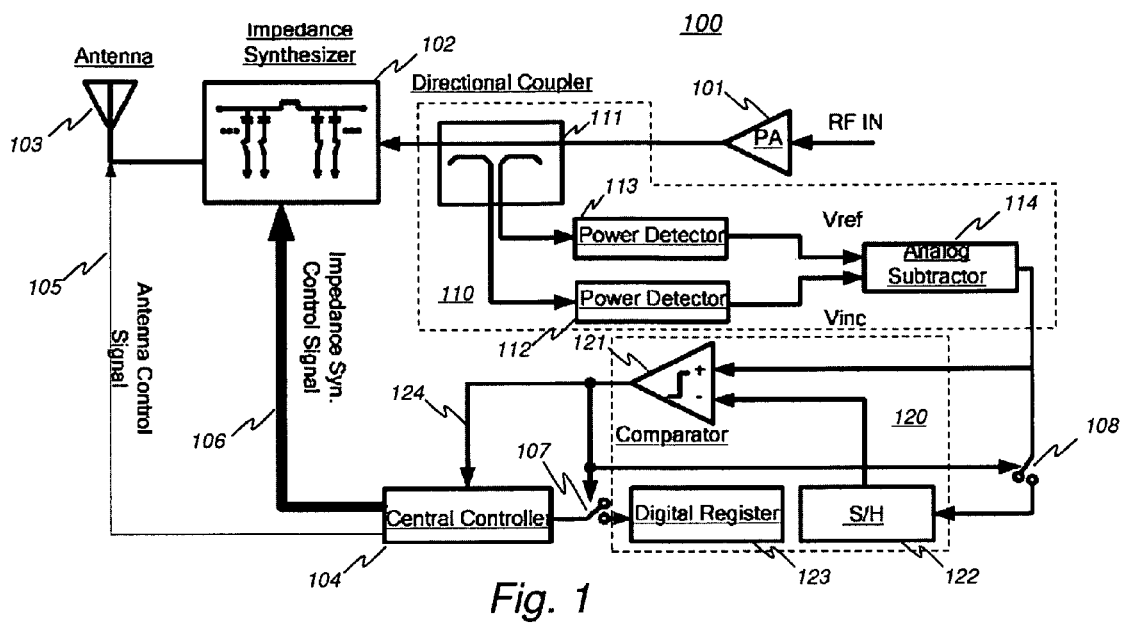
FIG. 1 shows a block diagram of a closed-loop automatic antenna tuning unit (ATU) in accordance with embodiments of the present invention.

Referring to FIG. 1, according to one embodiment, an automatic antenna tuning unit (ATU) 100 may include an Power Amplifier (PA) 101, a return loss detector 110, matching state searching circuit 120, central controller 104, and impedance synthesizer 102 connecting a transmitter, receiver or transceiver circuit (not shown) to antenna 103. Central controller 104 controls antenna aperture by generating an appropriate antenna control signal 105 to provide gross tuning of antenna 103. Return loss detector 110 may be connected to sample an RF signal to provide a return loss signal to matching state searching circuit 120. In response, the matching state searching circuit 120 generates a storing-action trigger signal. Central controller 104 may further store a current impedance matching state in digital register 123 through switch 107. Switches 107 and 108 are responsive to an output level of comparator 121 to store a current return loss signal in S/H 122 and a current impedance matching state in digital register 123. Central controller 104 is connected to provide a switch control signals 106 to impedance synthesizer 102 for coupling the RF signal and matching the impedance of an antenna 103 to power amplifier (PA) 101. Central controller 104 further applies the optimum matching state to the impedance synthesizer at the conclusion of the matching state search.

Return loss detector 110 may include a directional coupler 111 connected to receive the RF signal from, for example, PA 101 and provide incident and reflected sampled signals. Directional coupler 111 may be and/or constitute a three-line coupler device. Incident and reflected power detectors 112 and 113 receive the corresponding sampled signals to provide respective incident and reflected power signals $V_{inc}$ and $V_{ref}$, and subtractor 114 receives the incident and reflected power signals to provide the return loss signal. Preferably, incident and reflected power detectors 112 and 113 are logarithmic RF power detectors.

Matching state searching circuit 120 may include a sample and hold (S/H) circuit 122 connected to receive and selectively latch a return loss signal. Comparator 121 is connected to receive the current return loss signal from analog subtractor 114 and the previous best return loss signal stored in S/H circuit 122. The matching state searching circuit may further comprise a digital register 123 connected to receive and selectively store the current best impedance matching state.

Figure 2:
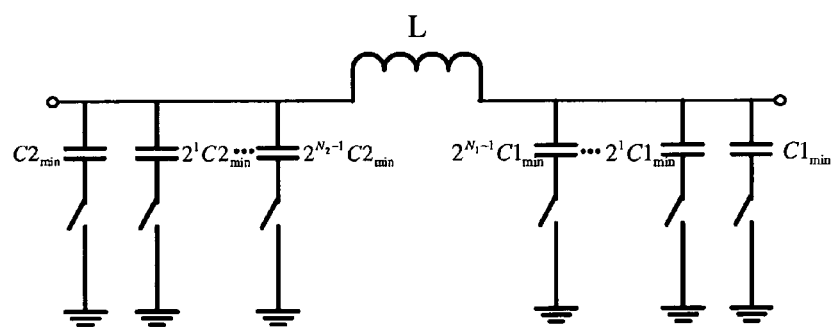
FIG. 2 is a schematic diagram of an impedance synthesizer configuration.

Impedance synthesizer 102 may be in the form of a low-pass-type pi-matching network including a series inductor and first and second banks of parallel switched capacitors connected to respective opposite terminals of the inductor and ground. Such a pi-matching circuit is illustrated in FIG. 2.

Figure 3:
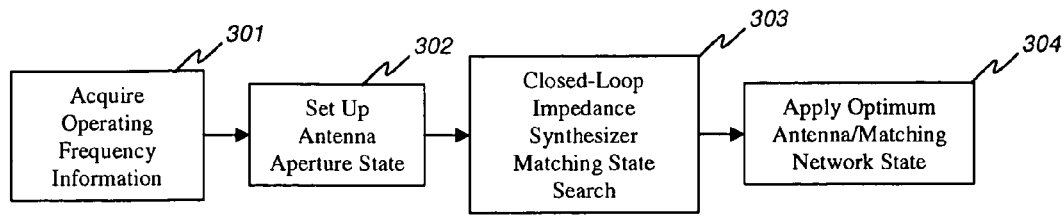
FIG. 3 is a system-level flowchart according to an embodiment of the invention.

A method of operating a system is shown in FIG. 3. Initially, at step 301, operating frequency information is acquired so that, at step 302, antenna aperture state can be setup. A closed-loop impedance synthesizer matching state search is performed at step 303 which is used to optimize the state of the impedance synthesizer at step 304.

Figure 4:
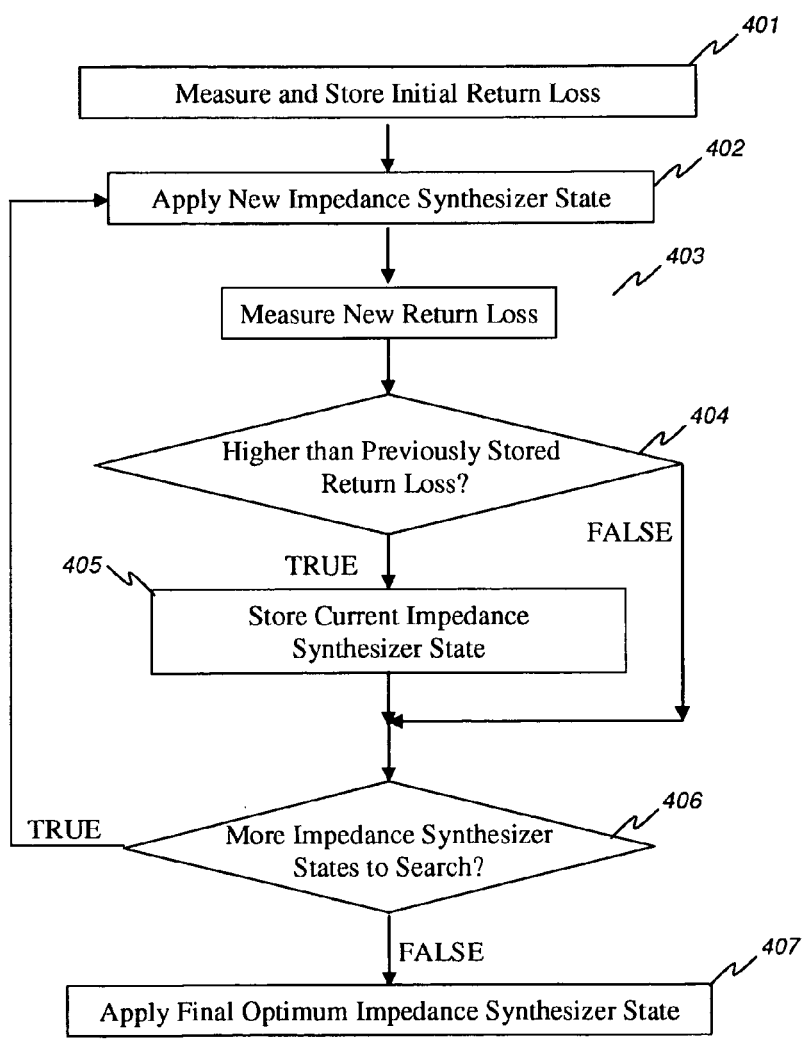
FIG. 4 is a flowchart of a method of providing closed-loop Impedance synthesizer matching state searching according to an embodiment of the invention.
Figure 5:
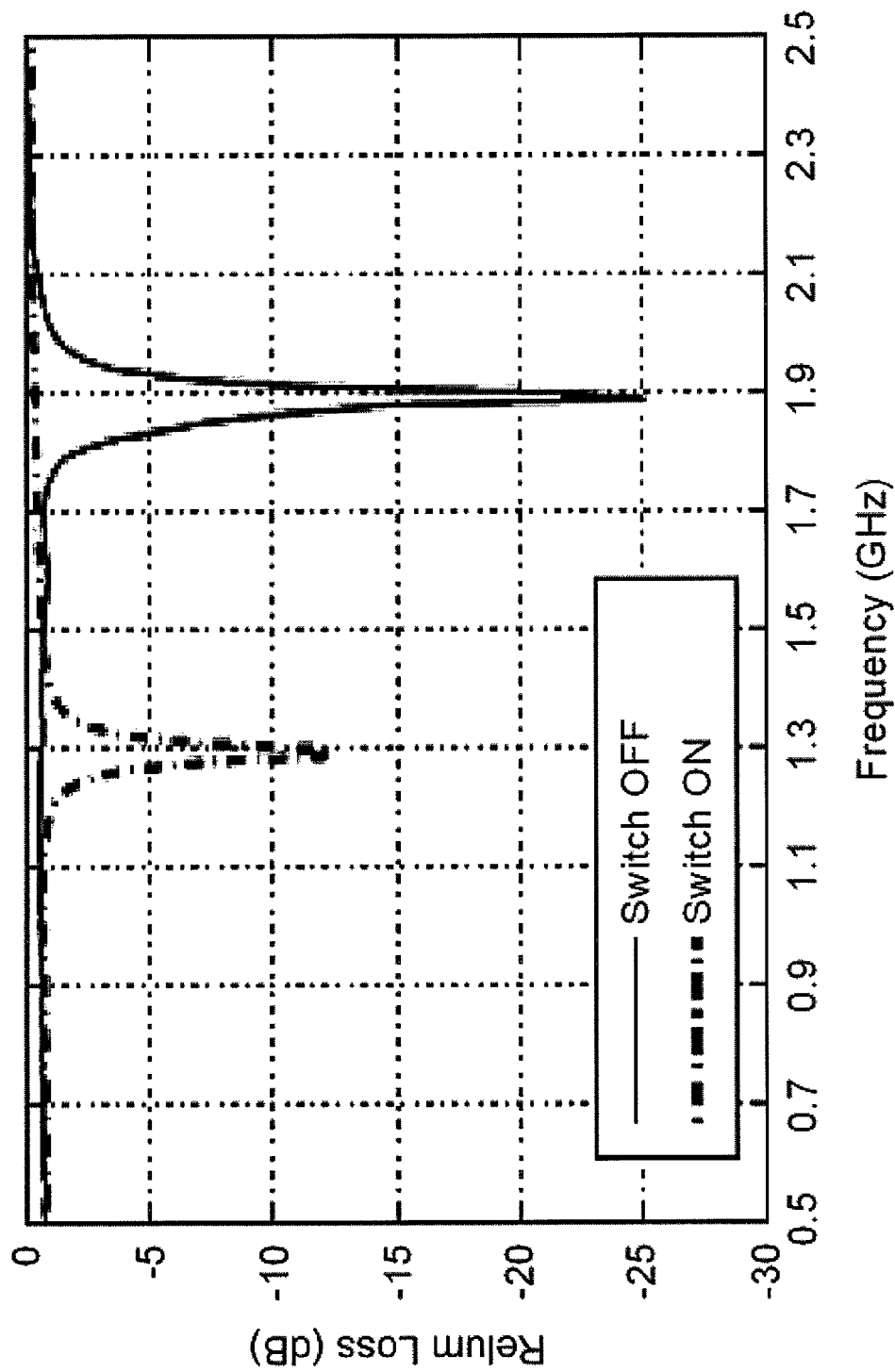
FIG. 5 is a graph of measurement results ($S_{11}$) of a reconfigurable shorted patch antenna (SPA)
Figure 6A:
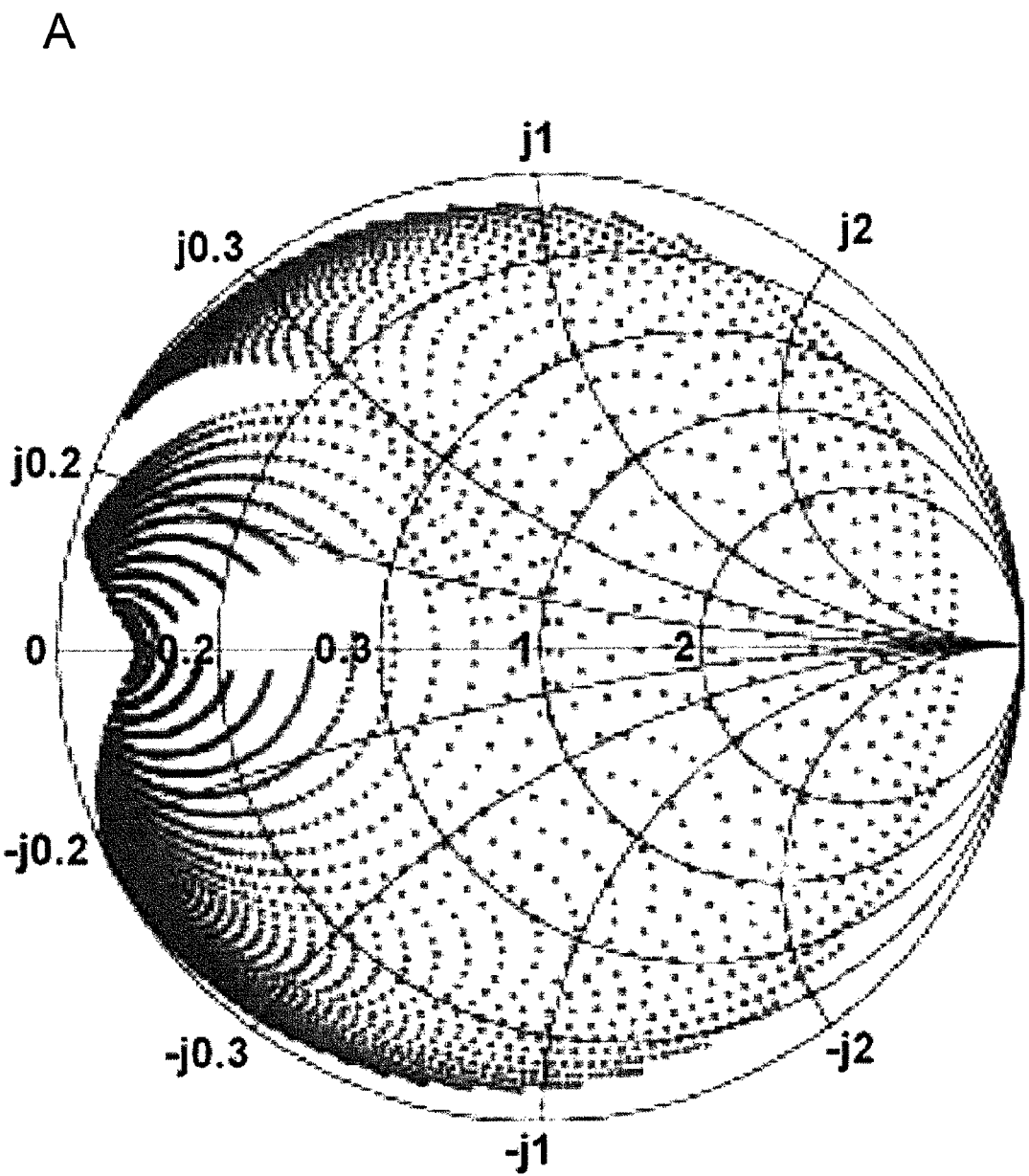
FIGS. 6A-6D are Smith Chart type nomograms of a simulated matchable domain with 12 capacitors ($N_1=N_2=6$, $2^{12}=4096$ states) at 800 Mhz, 900 Mhz, 1800 MHz and 1900 MHz, respectively.
Figure 6B:
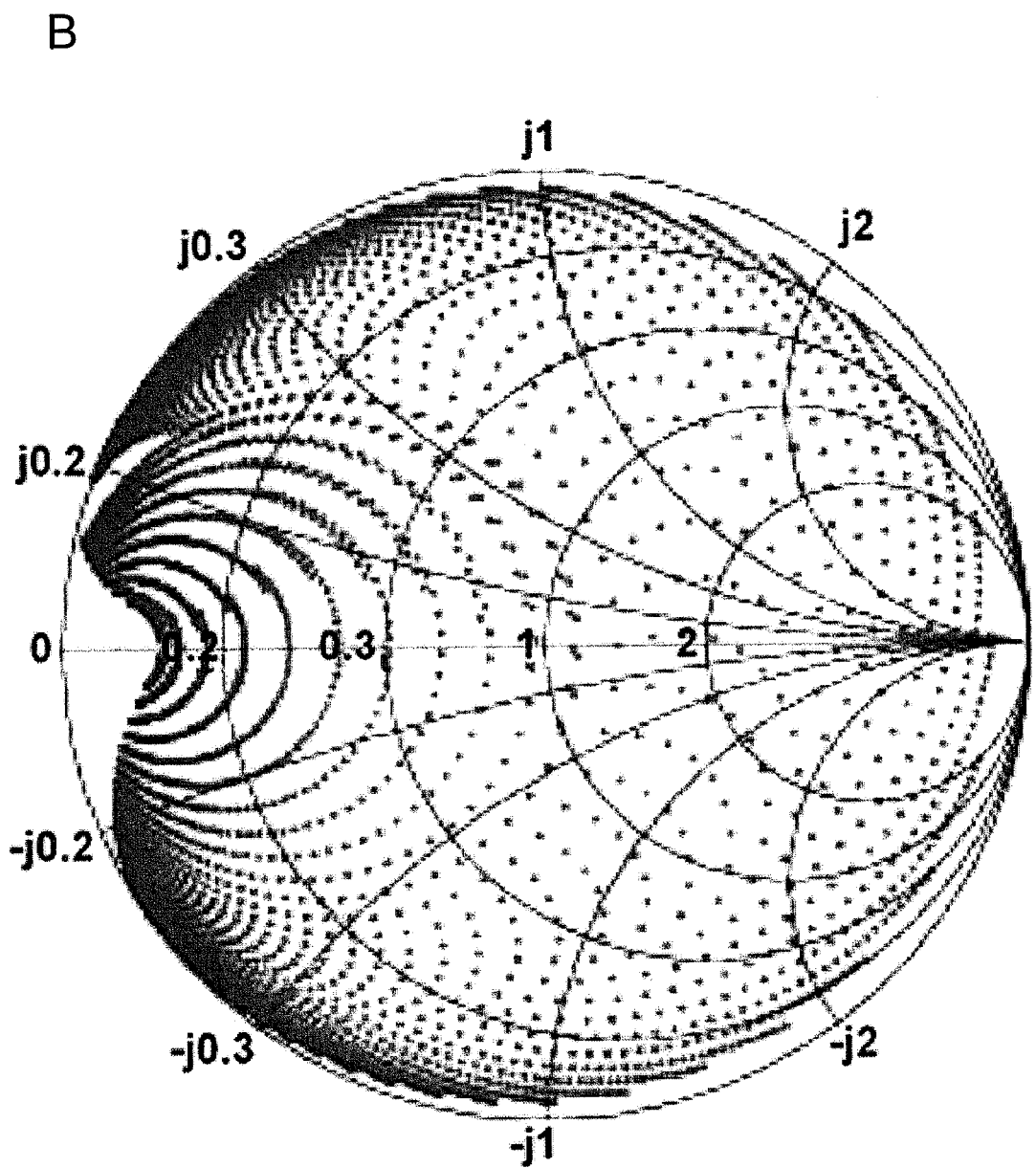
Figure 6C:
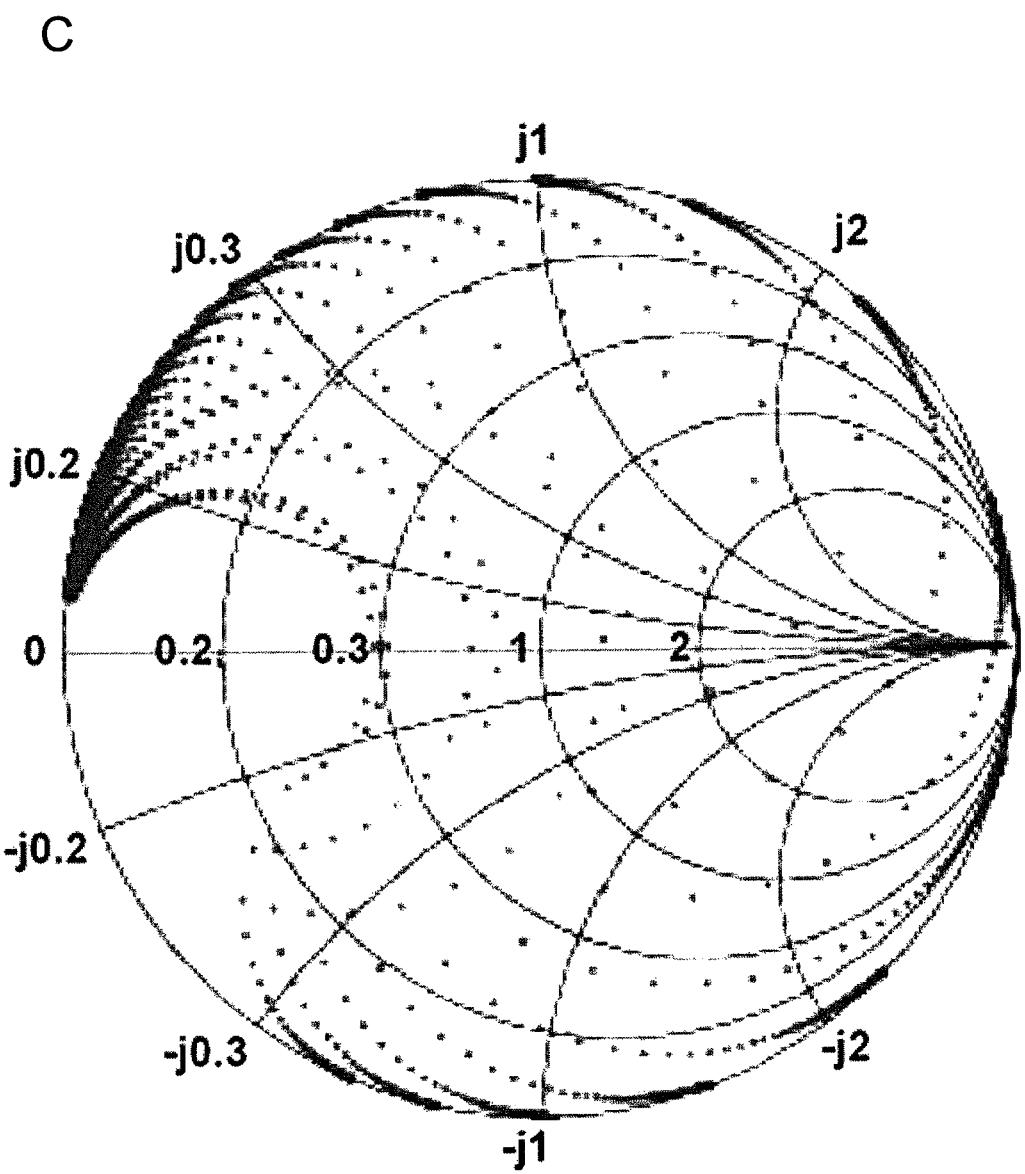
Figure 6D:
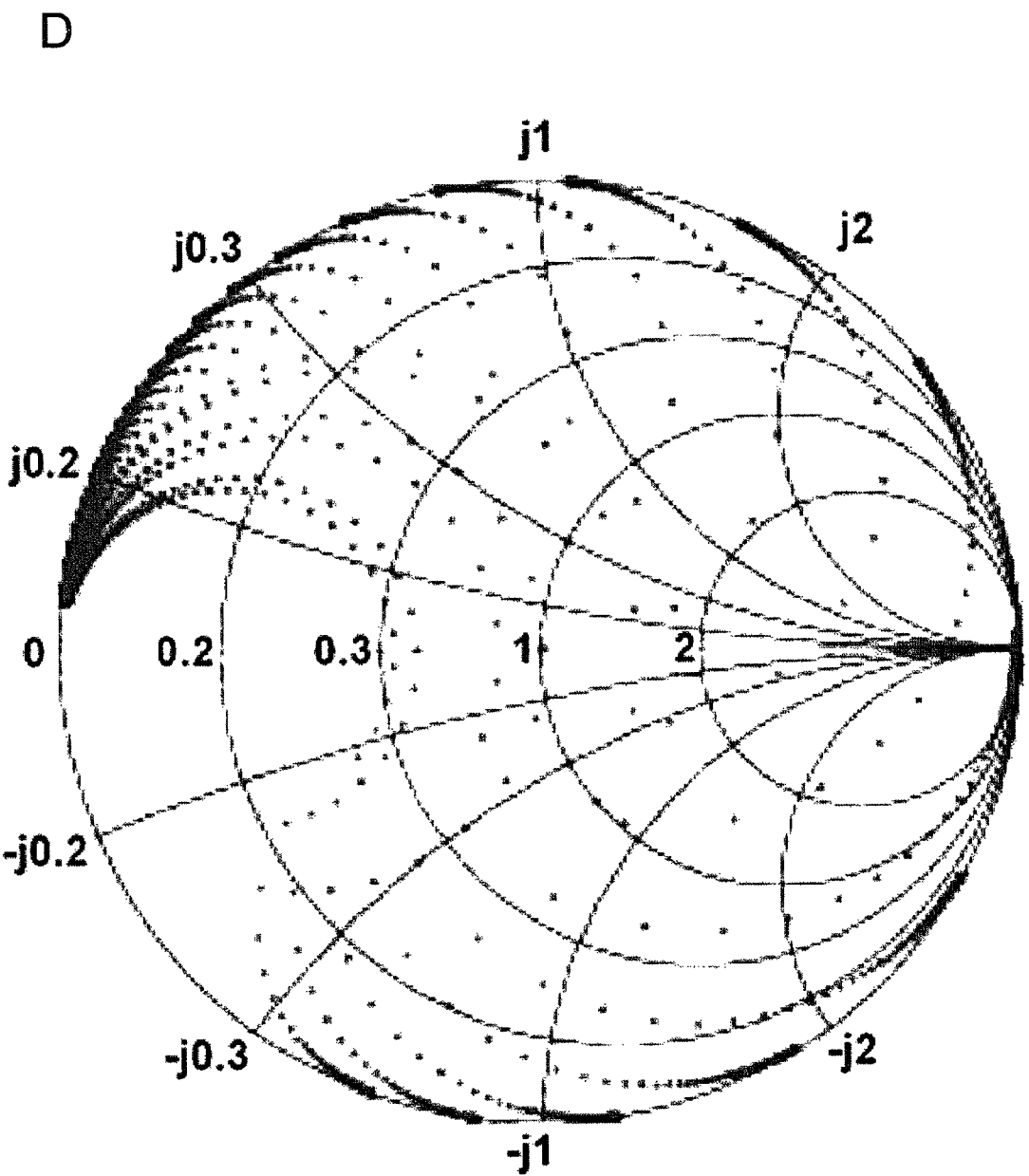

Details of the closed-loop impedance synthesizer matching state search step 303 are shown in the detailed flowchart of FIG. 4. At step 401 initial return loss is measured and stored and, at step 402, a resultant new impedance synthesizer state is applied. A new return loss is measured at step 403 and, if this value is higher than a previously stored return loss value (decision 404), a resultant new current impedance synthesizer state is stored into digital register at step 405; otherwise processing resumes at decision 406. At 406 a check is performed to see if all impedance synthesizer states have been considered, assuming an exhaustive search. Alternatively, only nearest neighbors may be considered in the case of, for example, a large number of possible synthesizer states that might preclude or make impractical an exhaustive search of all possible states. At the conclusion of the search, an optimized impedance synthesizer state is applied at step 407. Note that other search techniques may be implemented dependent upon, for example, the various matching criteria, circuit parameters, impedance synthesizer configuration, etc.

Figure 7:
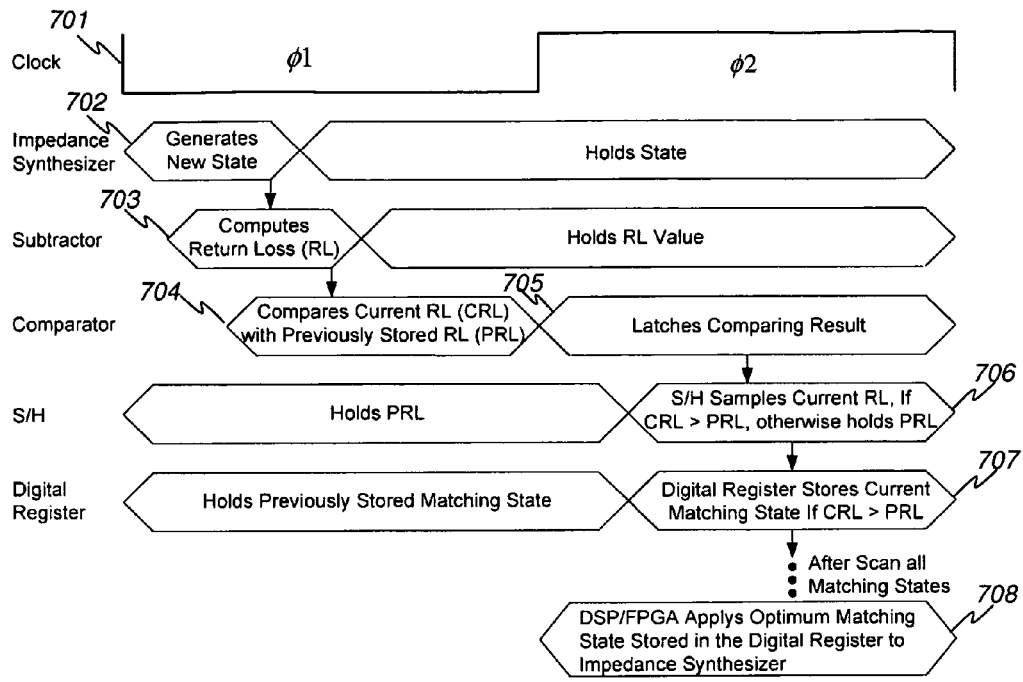
FIG. 7 is a timing diagram depicting system time domain operations.

Referring to FIG. 7, according to another embodiment of the invention, a method of matching the impedance of an antenna to a signal source may include generating a clock signal having first and second phases at step 701; generating a new matching state at a beginning of the first phase at step 702; computing a return loss at step 703; comparing the return loss to a previously stored return loss at step 704; latching a result of comparing at a beginning of the second phase at step 705; triggering a sampling action to store the return loss in response to a first value of the latched result at step 706; storing a current impedance matching state in response to the first value of the latched result at step 707; and configuring a matching circuit in response to the stored optimum impedance matching state to optimize a matching condition at the conclusion of the matching state search at step 708.

Antenna Tuning Unit Design

ESAs can be utilized as tunable filters as well as radiating elements resulting in a simplification of the radio's RF front-end design. This approach has the potential to lower the cost of next generation commercial and military radios while simultaneously enhancing performance. The measured return loss for each of the two coarse tuning states of the SPA used in a hardware demonstration is presented in FIG. 4. As expected, the response of the fabricated tunable antenna is very sensitive to its surrounding environment.

To provide a complex-conjugate matching capability for a wide range of antenna impedances under changing environments, a lowpass-type pi-matching network is considered due to its harmonic rejection capability and wide matchable impedance range. As previously mentioned, FIG. 2 illustrates the basic topology of the impedance synthesizer. With a fixed inductor and two binary variable capacitor banks, the matching network is capable of generating a wide range of tuning possibilities. The values of L, C1min and C2min, and the numbers (N1 and N2) of capacitors in the configuration are determined by the desired operating frequency and required range of impedances to be matched (i.e., the matchable domain). The practical realization of the impedance synthesizer may involve trade-offs between the matching domain and physical limitations of components.

A series of simulations has been performed by varying N1, N2, L, C1min and C2min in order to obtain reasonable matchable domains for the frequency range of 800 MHz to 1900 MHz. FIG. 6 shows the matchable domains at different frequencies. Each dot on the Smith Charts represents a value of antenna impedance that can be matched exactly to the system impedance of 50Ω. In practice, the losses and parasitic effects associated with the switch elements can deteriorate impedance synthesizer performance drastically. To reduce the loss and parasitics inherent in RF switches as well as the nonlinearity of the switches that can generate spurious frequency radiation and distortion of the signal, the use of RF MEMS switches in the impedance synthesizer is highly desirable. However, issues of high activation voltage, bulky package and may be cost prohibitive and thereby detract from using a large number of switches. Instead, the compromise between large matchable domains and small losses may dictate in some limited number of switches such as an impedance synthesizer with 6 PIN diode switches (N1=N2=3, 26=64 states).

To provide feedback information about the quality of match, an analog return loss detection block consisting of a coupled-line directional coupler, logarithmic RF power detectors and analog subtractor is used. In certain applications (e.g., CDMA), the incident power level is constantly being adjusted to optimize signal-to-interference-plus-noise ratio for all users. Hence, in a closed-loop tuning system it is generally necessary to measure incident power levels as well as reflected power levels in order to accurately determine the input reflection coefficient of the antenna.

The main design issue of the directional coupler is to sense the incident and reflected powers (with a reasonable power level required for an RF power detector), while delivering the input power to the antenna with minimum loss. For the concomitant weak couplings, a coupled-line coupler is appropriate for our ATU system. Preferably, the directional coupler is a three-line coupler that samples the incident and reflected signals at the input of the impedance synthesizer with different levels of coupling. This allows the very weak coupling to the incident signal (so as to avoid reducing to any noticeable extent the radio's transmitted signal), while simultaneously very strong coupling to the reflected signal (which allows increased return loss computation accuracy and/or precision).

The analog matching state searching circuit includes a S/H and comparator 121 as previously described. In order to quickly perform the search process, the system timing operation is arranged as shown in FIG. 7. At the beginning of phase 1 of each clock cycle, the impedance synthesizer begins with a new matching state, and settles in a time that is a fraction of phase 1. The analog subtractor rapidly computes the return loss (i.e., substantially instantaneously), and the result is compared with the one stored in the S/H. At the beginning of clock phase 2, the output of the comparator 121 is latched. If it is equal to HIGH (meaning that the instantaneous return loss is higher than the one stored), it triggers a sampling action to store the current value of return loss into S/H, and the digital register stores the current impedance matching state as well. At the end of the searching process, the Central Controller (CC) applies the last state stored in the digital register (having minimum return loss) to the impedance synthesizer which produces the optimum matching condition. The clock frequency is set to be 10 KHz, so an exhaustive searching process takes 6.4 ms. Speed can be greatly increased using an integrated circuit version of these circuits and more sophisticated search algorithms. For example, a nearest neighbors search algorithm may be used instead of an exhaustive search technique where there are a relatively large number of switch states to be considered.

The role of the CC is to reconfigure the antenna and impedance synthesizer such that the matching state is optimum by generating the required switch control signals. The CC may be, for example, some type of digital processor such as a field-programmable gate array (FPGA) or digital signal processor (DSP) that is running a search algorithm (e.g., nearest neighbors, exhaustive, etc.) and generates the required switch control signals. In addition, this processor may set the initial state of the antenna based on frequency information provided by the radio. After the antenna is initially configured by the open-loop signal based on the operating frequency information, the closed-loop system operates to ensure that the coarsely tuned antenna is automatically matched to the desired frequency under all environmental conditions. Based on return loss level, a search algorithm running on the CC tries to minimize the impedance mismatch of the antenna. Here, an exhaustive search may be used for demonstration purposes, although a more efficient nearest neighbors search algorithm may be employed as appropriate.

System Prototype and Test

Figure 8:
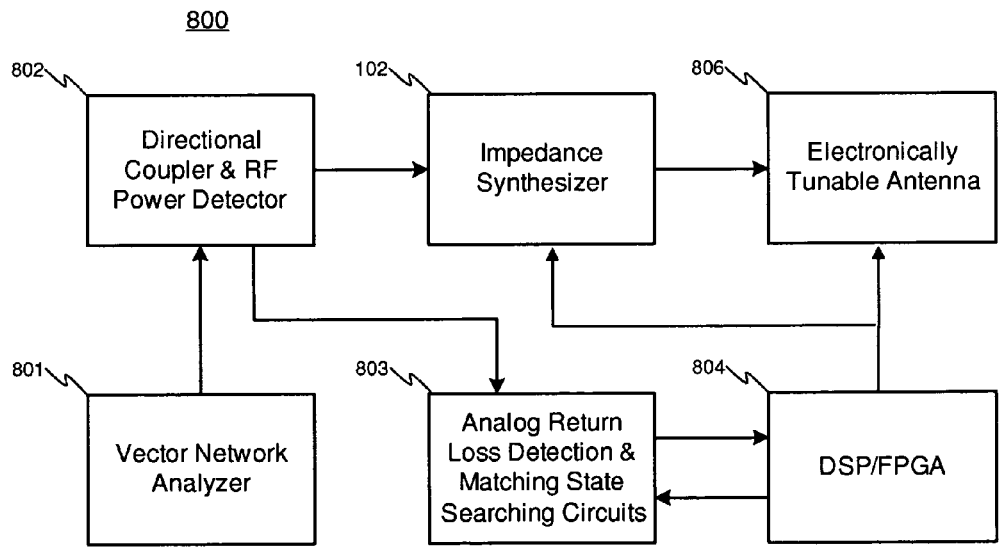
FIG. 8 is a block diagram of an ATU and of an ATU demonstration setup.

In order to experimentally verify the ATU functionality, the overall ATU prototype system was assembled and tested as illustrated in FIG. 8. The test system included a vector network analyzer 801 configured to provide an RF signal at a specified frequency within the operational frequency band of the electronically tunable antenna. In an operational environment, the vector network analyzer may be replaced with another signal source such as a software defined radio apparatus, a data communication system, a small aperture radar system, or the like.

At the beginning of the optimum matching state search, The DSP/FPGA 804 first generates an appropriate antenna control signal to provide gross tuning of electronically tunable antenna 806. The DSP/FPGA 804 further stores the initial configuration (matching state) of the impedance synthesizer, and analog return loss detection & matching state searching circuits 803 stores the initial return loss signal from direction coupler & RF power Detectors 802. Then the DSP/FPGA 804 communicates a control signal to change the configuration of the impedance synthesizer. The signal provided by the vector network analyzer 801 is then sampled by a directional coupler and RF power detector component 802. The directional coupler may include a three-line coupler connected to receive the signal from the vector network analyzer 801 and provide independent degrees of coupling of incident and reflected signals to provide incident and reflected sampled signals at desired levels. For instance, the coupler may be configured to provide a reflected sampled signal at a predetermined ratio to the actual power reflected in the system.

The power level of the incident sampled signal and the reflected sample signal are then detected by the RF power detectors 802 to provide an incident power signal and a reflected power signal. The incident power signal and the reflected power signal indicate a power level of the incident sampled signal and the reflected sampled signal respectively. The incident and reflected power signals are then communicated to the analogue return loss detection and matching state searching circuits 803.

Figure 11:
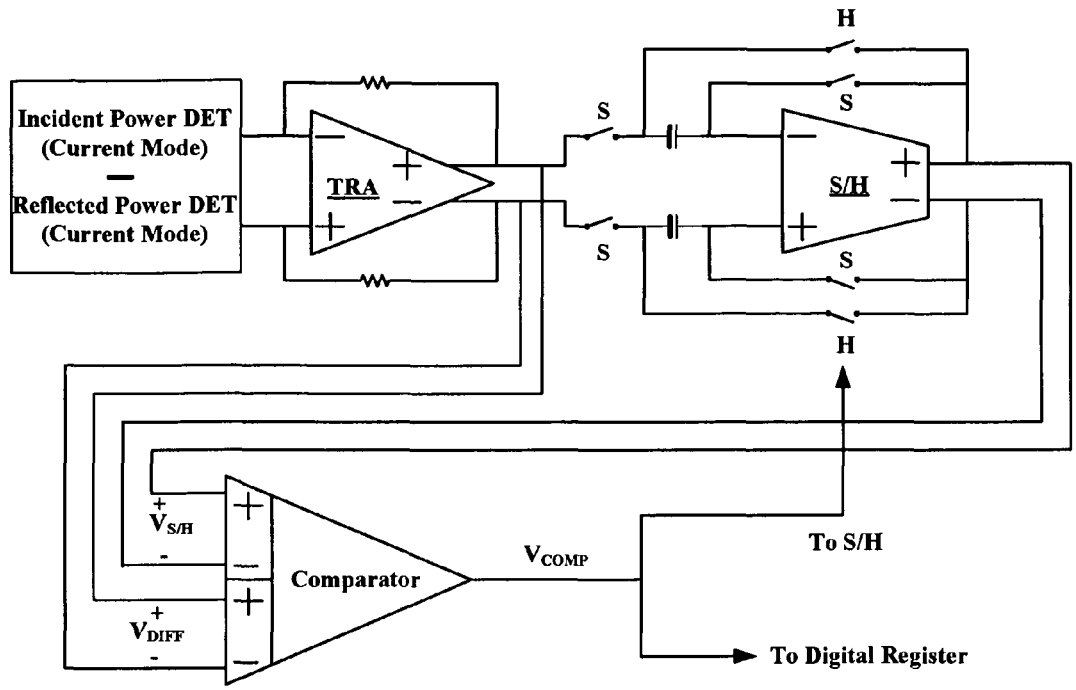
FIG. 11 illustrates an exemplary embodiment of the analog return loss detection and matching state searching circuits.
Figure 12:
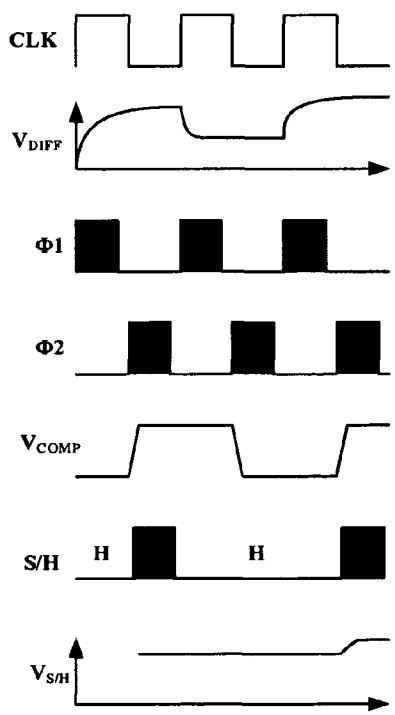
FIG. 12 is a timing and response diagram illustrating the operation and response of the exemplary embodiment illustrated in FIG. 11.

The analogue return loss detection and matching state searching circuits 803 may include an analogue subtractor 114, a comparator 121, and various other analogue and digital logic components including capacitors, resistors, digital registers 123, sample and hold devices 122, and the like. FIG. 11 illustrates an exemplary embodiment of the analogue return loss detection and matching state searching circuits 803. FIG. 12 is a timing and response diagram illustrating the operation and response of the exemplary embodiment illustrated in FIG. 11. The subtractor computes the return loss by finding the difference of the incident power level and reflected power level communicated from incident RF power detector and reflected RF power detector respectively. The comparator 121 compares the current return loss with the return loss previously stored in S/H 122. The output signal from the comparator 121 is then communicated to a DSP 804. In an alternative embodiment, the DSP 804 may be replaced with a FPGA, programmable logic chip (PLC), microprocessor, or the like.

Depending on the output of the comparator 121, if the current return loss is higher than the previously stored return loss, DSP 804 may place a current impedance matching state data value in a digital register, and the comparator 121 triggers a sampling action in the S/H to store a current return loss. Changing of the configuration of impedance synthesizer by DSP/FPGA 804 may be repeated until all matching states have been scanned. At the conclusion of matching state search, the optimum matching state stored in the digital register is applied to the impedance synthesizer. As described in FIG. 2, the impedance synthesizer may accomplish impedance matching through switching banks of capacitors in a low-pass pi-type filter comprising one or more series inductors or inductive elements, and one or more capacitors or capacitive elements.

Figure 9:
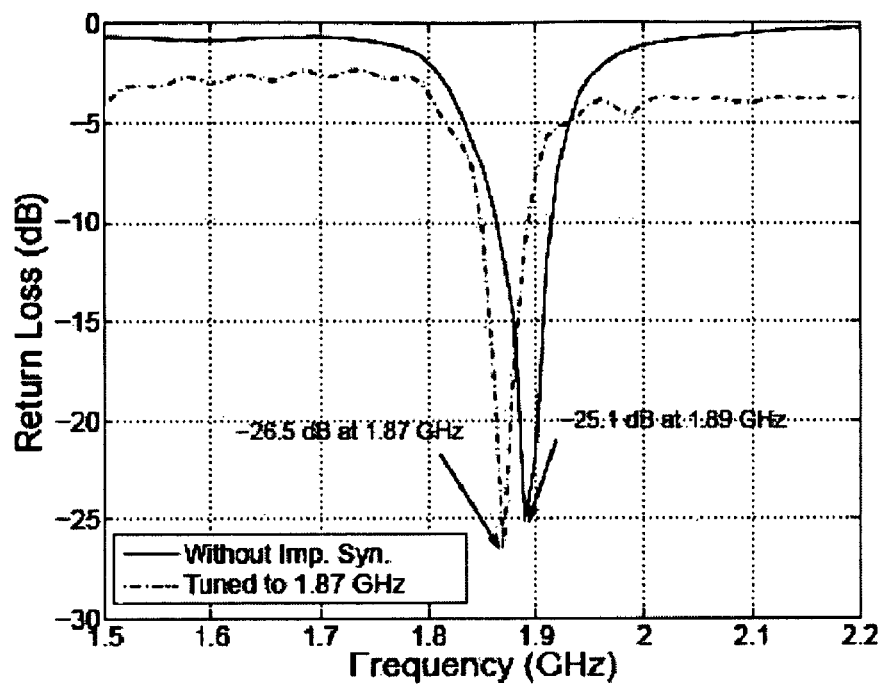
FIG. 9 is a graph of the tuning ability of an ATU according to an embodiment of the invention with an electrically small antenna tuned to 1870 MHz.

For example, consider the case where the frequency of an RF signal applied to the input of the directional coupler is set to 1.87 GHz. Initially, the state of the control element in the aperture of the electronically tunable antenna is set by a control signal from the CC. The solid line of FIG. 9 is the measured return loss of the SPA in this state. Next, the closed-loop scheme running on the CC tries to minimize the impedance mismatch between the antenna and impedance synthesizer. The dotted line of FIG. 9 shows the results achieved by the prototype. As can be seen, the ATU enables the highly selective frequency response of the electronically tunable antenna to be centered on the desired frequency.

Figure 10:
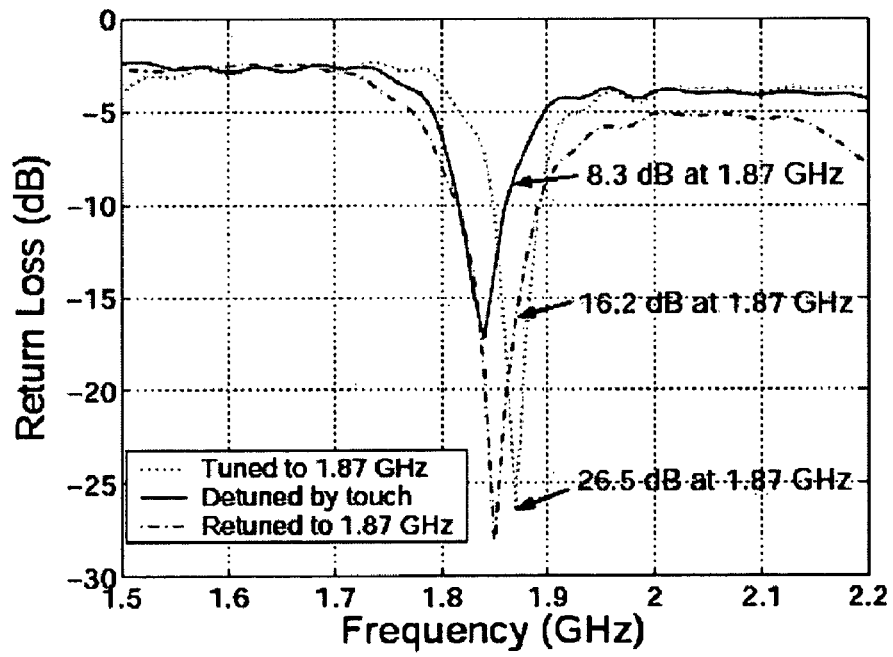
FIG. 10 is a graph of the automatic tuning ability of an ATU according to an embodiment of the invention.

Handheld devices are generally used under constantly changing environment conditions. To demonstrate how well the ATU compensates for changing environmental conditions, the antenna is brought to close proximity of a human hand. The solid line in FIG. 10 shows the detuned response of the antenna when it is in contact with the hand. As can be seen, significant degradation of the antenna's performance occurs. Once the antenna is detuned, the system automatically reconfigures the impedance synthesizer to correct for this sudden environmental change as shown by the dash-dot line in FIG. 10.

Figure 13:
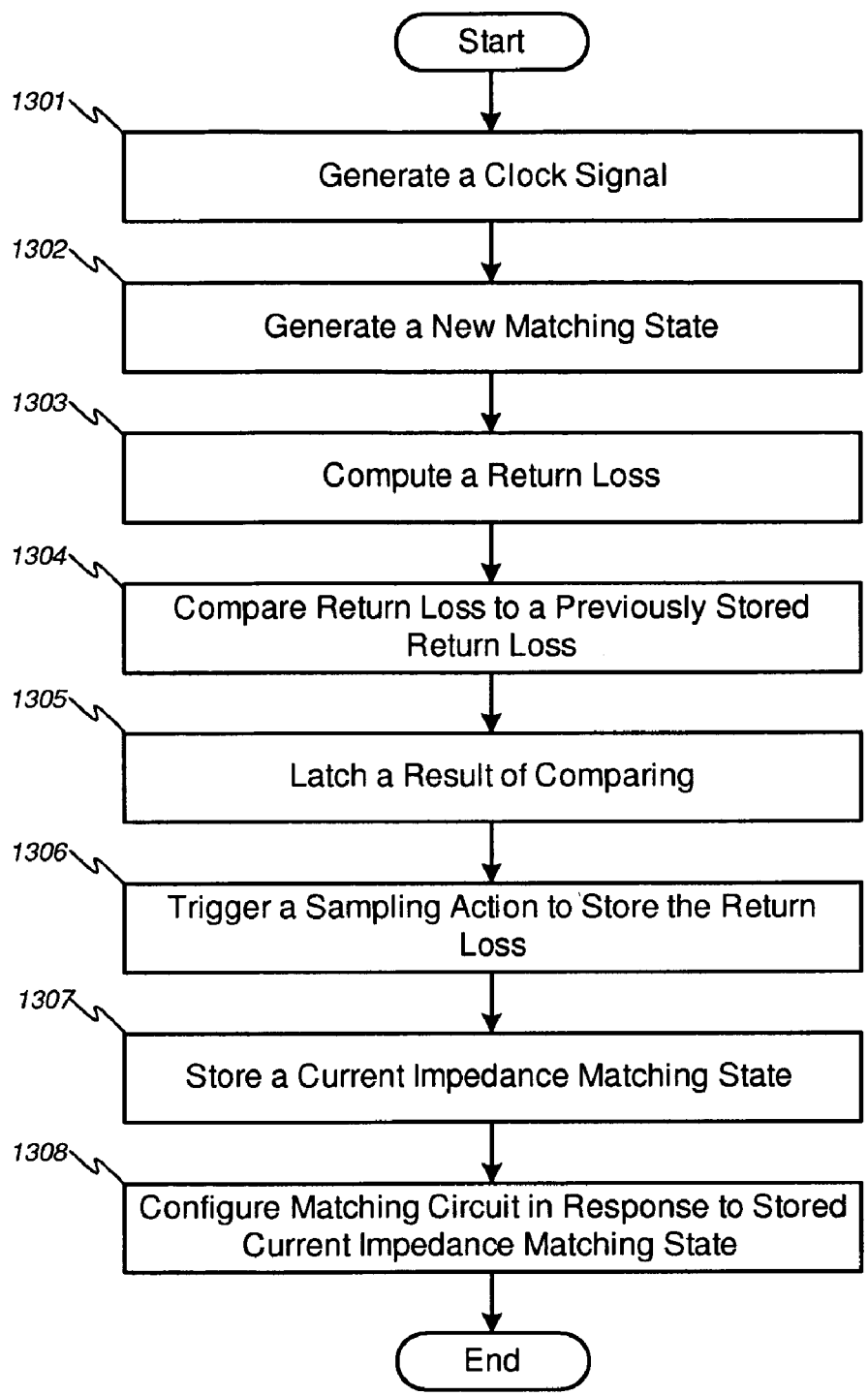
FIG. 13 is a schematic flowchart diagram illustrating one embodiment of a method of matching a transmission line to an antenna.

Referring to FIG. 13, the method of matching a transmission line (not shown) to an antenna 806 starts be generating 1301 a clock signal. In one embodiment, the clock signal may be generated by a local oscillator, a reference clock source, an oscillator associated with the DSP 804 or the like. Preferably, the clock signal has a first phase and a second phase as illustrated in FIG. 7.

The central controller 104 may then generate 1302 a new matching state at the rising clock edge of the first phase of the clock signal. As described above, the central controller 104 may include a DSP 804. The directional coupler and RF power detector 802 may then provide the incident power signal and reflected power signal which are used by the analogue return loss detection circuit 803 to compute 1303 a return loss. The matching state searching circuit 803, including the comparator 121 may then compare 1304 the return loss to a return loss value previously stored in the S/H 122. The matching state searching circuit 803 may latch 1305 the result of comparing. In one embodiment, the result is latched 1305 on the rising edge of the second phase of the clock signal.

In one embodiment, the DSP 804 may trigger 1306 a sampling action to store the return loss signal in response to a first value of the latched result. Specifically, it the return loss is lower than the stored value, the new value may be stored. In a further embodiment, the sample of the return loss is stored 1306 in the S/H. Additionally, the digital register 123 may store 1307 a current impedance matching state for reference by the impedance synthesizer 102. Finally, the impedance synthesizer 102 configures 1308 a matching circuit in response to the stored current impedance matching state.

As described herein, embodiments of the present invention provide an automatic antenna tuning system with efficient analog return loss detection and matching state searching circuits for potential use with software defined and cognitive radios.

All of the apparatus and methods disclosed and claimed herein can be reduced to practice and executed without undue experimentation in light of the present disclosure. While the apparatus and methods of this disclosure may have been described in terms of preferred embodiments, it will be apparent to those of ordinary skill in the art that variations may be applied to the apparatus, components, methods and in the steps or in the sequence of steps of the method described herein without departing from the concept, spirit and scope of the disclosure. All such similar substitutes and modifications apparent to those skilled in the art are deemed to be within the spirit, scope, and concept of the disclosure as defined by the appended claims.

The invention claimed is:

1. An automatic antenna tuning unit comprising:
   a return loss detector configured to sample a radio frequency signal to provide an analog quality of match signal;
   a matching state searching circuit configured to receive said analog quality of match signal and, in response, selectively store a return loss value and an impedance matching state;
   a central controller responsive to said return loss value and said impedance matching state connected to provide a switch control signal and apply an optimum matching state to an impedance synthesizer at the conclusion of the matching state search; and
   the impedance synthesizer responsive to said switch control signal for coupling and matching said radio frequency signal to an antenna.

2. The automatic antenna tuning unit according to claim 1, wherein said return loss detector comprises:
   a directional coupler configured to receive said radio frequency signal and provide incident and reflected sampled signals;
   an incident power detector configured to receive said incident sampled signal to provide an incident power signal;
   a reflected power detector configured to receive said reflected sampled signal to provide a reflected power signal; and
   an analog subtractor configured to receive said incident and reflected power signals to provide said analog quality of match signal.

3. The automatic antenna tuning unit according to claim 2, wherein said incident and reflected power detectors comprise logarithmic radio frequency power detectors.

4. The automatic antenna tuning unit according to claim 1, wherein said return loss detector comprises:
   a three-line coupler configured to receive said radio frequency signal, providing independent degrees of coupling of incident and reflected signals to provide incident and reflected sampled signals of desired levels;
   an incident power detector configured to receive said incident sampled signal to provide an incident power signal;
   a reflected power detector configured to receive said reflected sampled signal to provide a reflected power signal; and
   a subtractor configured to receive said incident and reflected power signals to provide said analog quality of match signal.

5. The automatic antenna tuning unit according to claim 1, wherein said matching state searching circuit comprises:
   a sample and hold (S/H) circuit configured to receive and selectively latch analog quality of match signal; and
   a comparator configured to receive said analog quality of match signal and an output from said S/H circuit to provide said storing-action trigger signal.

6. The automatic antenna tuning unit according to claim 1, wherein said a central controller comprises a digital processor operational to set an initial state of said antenna based on operating frequency information and running a search algorithm to thereby providing said switch control signal.

7. The automatic antenna tuning unit according to claim 1, wherein said matching state searching circuit further comprises a digital register configured to receive and selectively store said impedance matching state.

8. The automatic antenna tuning unit according to claim 1, wherein said impedance synthesizer comprises a lowpass-type pi-matching network.

9. The automatic antenna tuning unit according to claim 8, wherein said lowpass-type pi-matching network comprises a series inductor and first and second banks of parallel switched capacitors connected to respective opposite terminals of said inductor and ground.

10. A method of matching a transmission line to an antenna comprising the steps of:
    generating a clock signal having first and second phases;
    generating a new matching state at a beginning of said first phase;
    computing a return loss;
    comparing said return loss to a previously stored return loss;
    latching a result of said step of comparing at a beginning of said second phase;
    triggering a sampling action to store said return loss in response to a first value of said latched result;
    storing a current impedance matching state in response to said first value of said latched result; and
    configuring a matching circuit in response to said stored impedance matching state to optimize a matching condition at the conclusion of matching state search.

11. The method according to claim 10, wherein computing a return loss further comprises:
    receiving a radio frequency signal;
    providing a sample of an incident signal;
    providing a sample of a reflected signal;
    providing an incident power signal in response to the sample of the incident signal;
    providing a reflected power signal in response to the sample of the reflected signal; and
    generating an analog quality of match signal in response to the incident power signal and the reflected power signal.

12. The method according to claim 11, wherein providing the sample of an incident signal and of a reflected signal further comprises providing independent degrees of coupling of the incident signal and of the reflected signal to providing the sample of the incident signal and the sample of the reflected signal at desired levels.

13. The method according to claim 10, wherein comparing the return loss to a previously stored return loss further comprises:
    receiving the analogue quality of match signal;
    selectively latching the analogue quality of match signal in a sample and hold (S/H) circuit; and
    comparing the analogue quality of match signal and an output signal from the S/H circuit.

14. The method according to claim 10, wherein configuring the matching circuit further comprises setting an initial state of the antenna based on operating frequency information and running a search algorithm to thereby providing the switch control signal.

15. The method according to claim 10, further comprising storing the impedance matching state in a digital register.

16. A system for matching a transmission line to an antenna comprising:
    a signal source configured to generate a radio frequency signal for transmission;
    a transmission line coupled to the signal source configured to conduct the radio frequency signal;
    an antenna coupled to the transmission line configured to transmit the radio frequency signal wirelessly; and
    an antenna tuning unit coupled to the antenna and to the transmission line comprising:
       a return loss detector connected to sample the radio frequency signal to provide an analog quality of match signal;

a matching state searching circuit configured to receive said analog quality of match signal and, in response, selectively store a return loss value and an impedance matching state;

a central controller responsive to said return loss value and said impedance matching state for providing a switch control signal and apply an optimum matching state to an impedance synthesizer at the conclusion of the matching state search; and the impedance synthesizer responsive to said switch control signal for coupling and matching said radio frequency signal to an antenna.

17. The system according to claim 16, further comprising:

a directional coupler configured to receive said radio frequency signal and provide incident and reflected sampled signals;

an incident power detector configured to receive said incident sampled signal to provide an incident power signal;

a reflected power detector configured to receive said reflected sampled signal to provide a reflected power signal; and a subtractor configured to receive said incident and reflected power signals to provide said analog quality of match signal.

18. The system according to claim 17, wherein said incident and reflected power detectors comprise logarithmic radio frequency power detectors.

19. The system according to claim 16, wherein said a central controller comprises a digital processor operational to set an initial state of said antenna based on operating frequency information and running a search algorithm to thereby providing said switch control signal.

20. The system according to claim 16, wherein said impedance synthesizer comprises a lowpass-type pi-matching network having a series inductor and first and second banks of parallel switched capacitors connected to respective opposite terminals of said inductor and ground.

* * * * *

UNITED STATES PATENT AND TRADEMARK OFFICE
CERTIFICATE OF CORRECTION

PATENT NO. : 8,095,085 B2
APPLICATION NO. : 12/134438
DATED : January 10, 2012
INVENTOR(S) : Hang Song et al.

It is certified that error appears in the above-identified patent and that said Letters Patent is hereby corrected as shown below:

In column 1, lines 16-19, delete paragraph and insert
--This invention was made with government support under Grant No. 0226846 awarded by the National Science Foundation. The government has certain rights in the invention.-- therefor.

In claim 16, column 12, line 65, delete "connected" and insert --configured-- therefor.

Signed and Sealed this
Twentieth Day of March, 2012

David J. Kappos
*Director of the United States Patent and Trademark Office*